United States Patent [19]

Abdel-Ghaffar et al.

[11] Patent Number: 4,951,284
[45] Date of Patent: Aug. 21, 1990

[54] METHOD AND MEANS FOR CORRECTING RANDOM AND BURST ERRORS

[75] Inventors: Khaled Abdel-Ghaffar, Davis; Martin A. Hassner, Palo Alto, both of Calif.

[73] Assignee: International Business Machines Corporation, Armonk, N.Y.

[21] Appl. No.: 284,979

[22] Filed: Dec. 14, 1988

[51] Int. Cl.[5] .............................................. G06F 11/10
[52] U.S. Cl. .................................. 371/38.1; 371/37.7; 371/40.3
[58] Field of Search .................. 371/37.2, 38.1, 39.1, 371/40.1, 40.3, 37.6, 37.1, 37.2

[56] References Cited

U.S. PATENT DOCUMENTS

| | | | |
|---|---|---|---|
| 4,525,838 | 6/1985 | Patel | 371/37.4 |
| 4,706,250 | 11/1987 | Patel | 371/39 |
| 4,833,679 | 6/1989 | Anderson | 371/37.7 |
| 4,849,975 | 7/1989 | Patel | 371/38.1 |

Primary Examiner—Jerry Smith
Assistant Examiner—Robert W. Beausoliel
Attorney, Agent, or Firm—Henry E. Otto, Jr.

[57] ABSTRACT

A method and means is described for correcting multiple error bursts in data recorded on a storage medium in blocks, comprising a plurality of subblocks. After reading the data, decoded block check syndromes are algebraically summed with estimated block check syndromes to provide a set of syndromes for a code for locating subblocks having an error burst. This set of syndromes is decoded to identify each subblock having an error burst. Concurrently block level syndromes are computer to identify the locations and values of errors within the subblocks having error bursts. During writing, the data in all subblocks of a block is encoded and block level syndromes are generated for these subblocks. These block level syndromes are multiplied by a series of preselected weighting factors ($\alpha^1 \ldots \alpha^{1(B-1)}$) according to the location index 1 of the sublock within the block and as multiplied, each is stored in a different one of B buffers. These are cumulatively summed to produce block check syndromes, which are encoded after the last subblock of the block is written to provide check bytes for their protection. These check bytes and the weight cumulative sums are stored on the medium at the end of the block as block check syndromes.

22 Claims, 4 Drawing Sheets

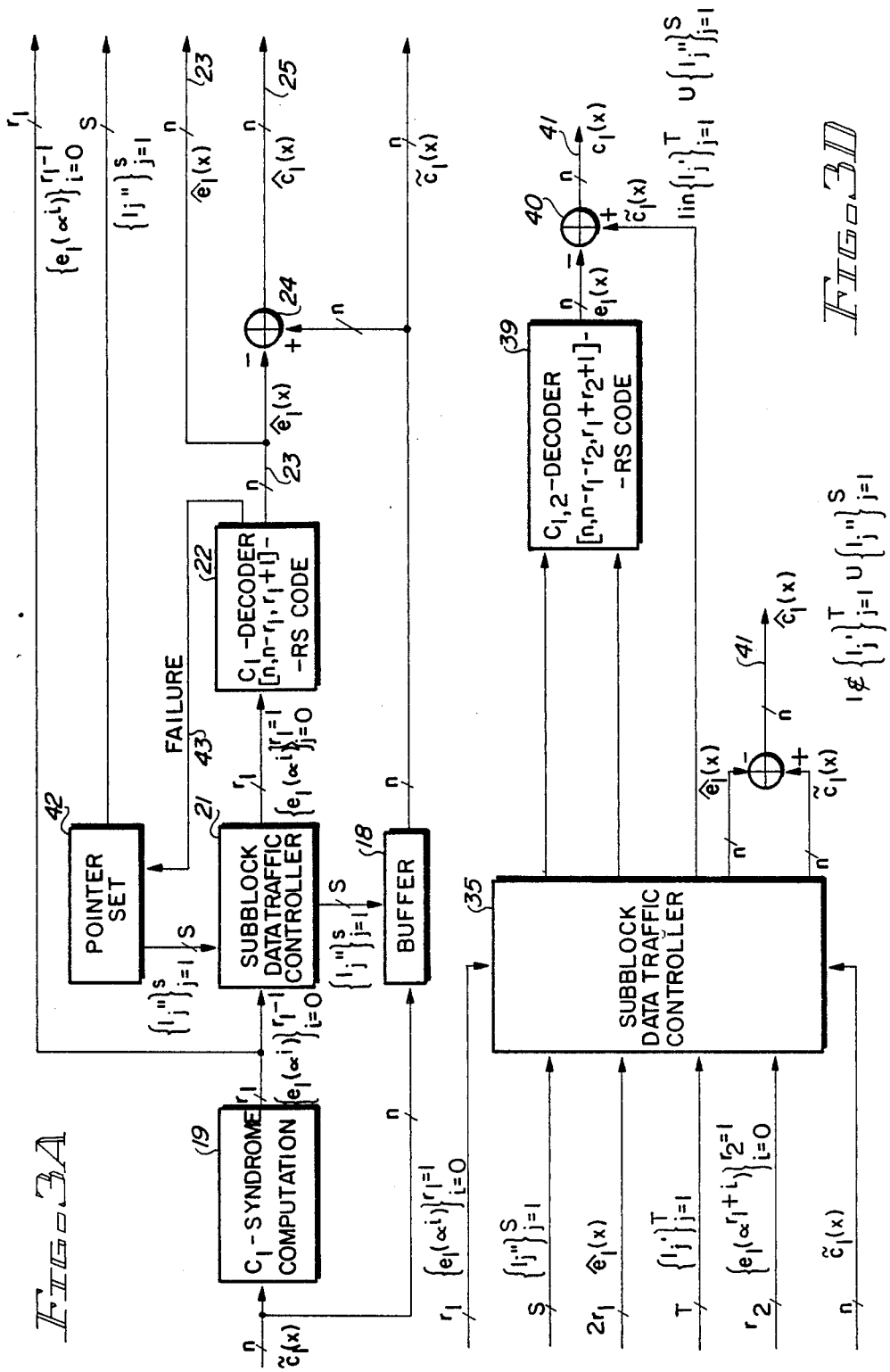

METHOD AND MEANS FOR CORRECTING RANDOM AND BURST ERRORS

DESCRIPTION

1. Technical Field

This invention relates to a method and means for locating and correcting both random and burst errors in data recorded on a storage medium in blocks comprising subblocks, and more specifically relates to such a method and means which includes error correction code (ECC) for which decoded and estimated block check syndromes are generated.

2. Background of the Invention

In U.S. Pat. No. 4,706,250 assigned to the assignee of the present invention, there is disclosed a two-level error correction code structure in an improved multibyte error-correcting subsystem. Data is formatted on a disk track into a number of subblocks, each within a respective block. There are also two sets of three subblock check bytes. One set is associated with the even phases and the other with the odd phase, this being due to two-phase interleaving.

With this arrangement, it is possible to correct one error in each subblock at a first (subblock) level of correction, and correct two errors in one of the subblocks of the block at a second (block) level of correction. Thus, if there are two or more errors in a subblock, due for example to an error burst, the ECC will be unable to correct all the errors. To partially address this problem, the size of the subblocks could be reduced from say 100 bytes to 50 bytes to reduce the likelihood that more than one error would occur in each subblock. But, associated with each subblock (as shown in FIG. 1 of U.S. Pat. No. 4,706,250) is a set of subblock check bytes which, as illustrated, are two-way interleaved. Hence doubling the number of subblocks doubles the number of subblock check bytes, thus increasing the overhead.

In the copending application of Eggenberger et. al., U.S. Ser. No. 247,461, filed Sept. 21, 1988, assigned to the assignee of the present invention, a method and means are disclosed capable of correcting both random conventional errors and a long burst error of up to N consecutive bytes in a two-level ECC system. This is achieved by adding at the end of each block a series of N sequential parity check bytes. During reading, after the generation of the ECC syndromes, parity syndromes are generated by comparing parity check bytes computed from the data bytes and check bytes as read with the parity check bytes as written. Each syndrome is a byte in length. In response to a long-burst error, a pointer is generated to the first of N consecutive bytes in a block that could have been influenced by the error. Then those ECC syndromes not dependent on the N bytes identified by the pointer are used to correct any correctable errors. Following this, the parity syndromes are adjusted according to the errors thus corrected. The adjusted parity syndromes are then used to correct correctable errors in the N bytes indicated by the pointer. Any unused ECC syndromes are adjusted according to the errors thus corrected by the adjusted parity syndromes; whereupon the adjusted ECC syndromes are used to correct all correctable errors then remaining. This method and means operates satisfactorily but requires that N parity bytes be added at the end of each block in order to correct an error burst N bytes long, and requires a pointer to each error burst.

It is desirable to provide an improved two-level ECC system of the above general type capable of locating any preselected number of subblocks in error containing up to a preselected number of bytes in error, whether nonconsecutive or in bursts. Also, it would be desirable to provide such a system wherein the location of the subblocks in error may be specified either by an externally generated pointer or the location may be unknown, without reducing first (subblock) level correction capability.

Toward this end, and according to the invention, a method and means are provided for correcting multiple burst errors in a storage medium on which data is recorded in blocks that comprise subblocks of data bytes and redundant check bytes for which decoded and estimated block syndromes are generated during reading. After reading the data, the decoded block syndromes for each block are algebraically summed with the estimated block syndromes for that block to provide a set of syndromes for a code which locates subblocks in that block having error bursts. This set of syndromes is then decoded to generate algebraic pointer(s) to identify each subblock having an error burst. Thereafter block syndromes for each subblock having an error burst are computed at 33 and used in conjunction with previously computed subblock syndromes from 20 for those subblocks and both sets of syndromes are decoded to identify the locations and the values of the errors within those subblocks having error bursts.

BRIEF DESCRIPTION OF THE DRAWINGS

FIGS. 3A–3D, when taken such that the right edge of FIG. 3A is matched to the left edge of FIG. 3B, the right edge of FIG. 3B to the left edge of FIG. 3C, and the right edge of FIG. 3C matched to the left edge of FIG. 3D constitute a block diagram of the decoder portion of the apparatus embodying the invention.

DESCRIPTION OF PREFERRED EMBODIMENT

INTRODUCTION

Figure 1:
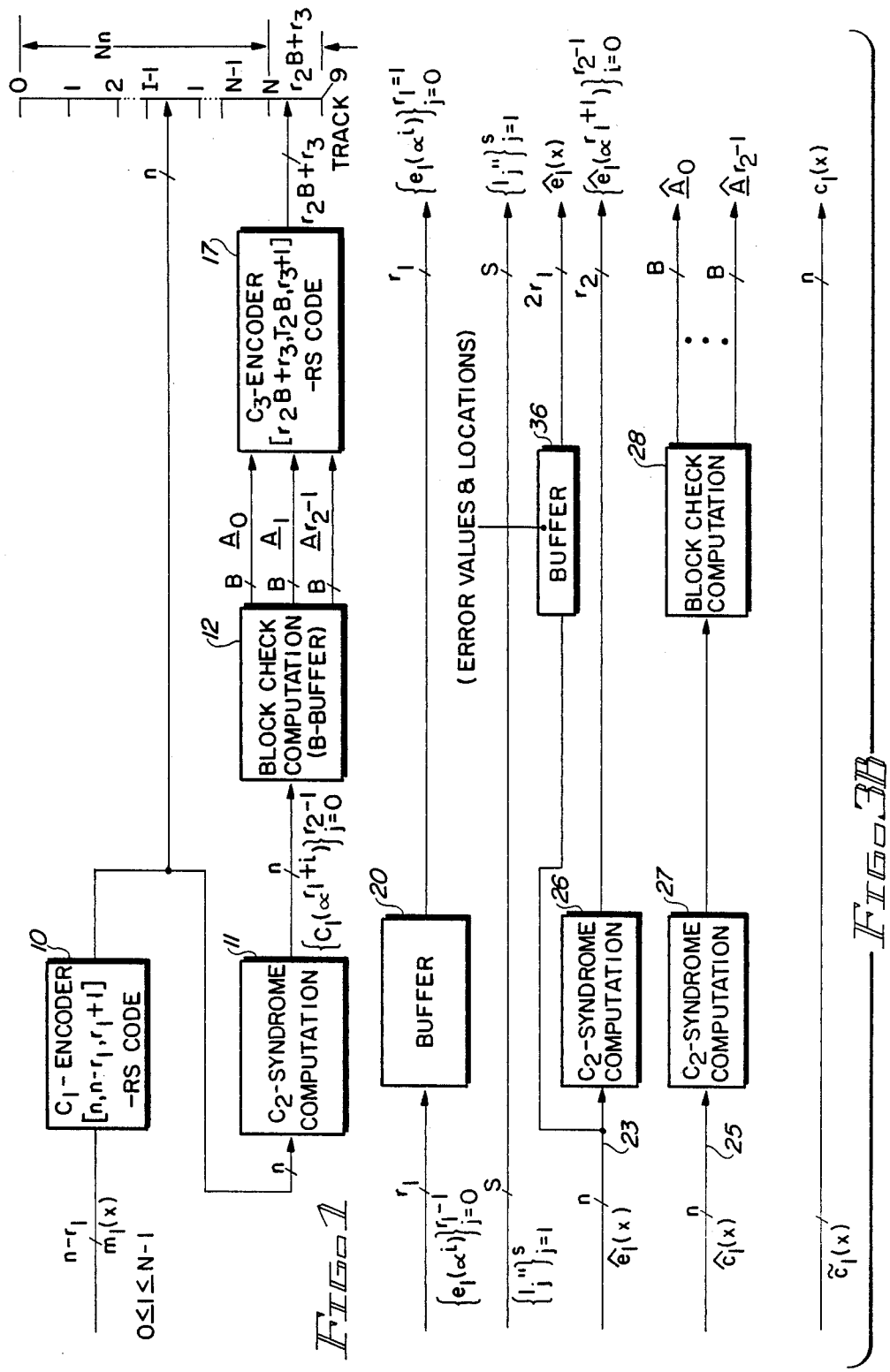
FIG. 1 is a schematic block diagram of the encoder portion of an apparatus embodying the invention.

The method and apparatus embodying the invention are shown applied to a two-level ECC system of the type disclosed in the above-cited U.S. Pat. No. 4,706,250. As shown in FIG. 1 of said patent, data is recorded in blocks of variable (or fixed) length each comprising a plurality of subblocks, of the same length except possibly the last. Each subblock comprises a variable (or fixed) number of data bytes and six subblock check bytes for first level (subblock) error correction. At the end of the last subblock in the block are four CRC bytes for data integrity checking, followed by two block check bytes for second level (block) error correction.

In this two-level ECC system, the data is encoded on the subblock (first) level by a Reed-Solomon (RS) [n, $n-r_1$, $r_1+1$]-encoder, where n is the number of bytes in the encoded subblock, $r_1$ is the number of subblock check bytes in the encoded subblock, and $r_1+1$ is the minimum Hamming distance or the separation achieved among subblocks. This distance suffices for the correction of up to $t_1 = \lfloor r_1/2 \rfloor$ byte errors in a subblock. The fundamental feature of this prior art two-level architecture is to compute $r_2$ block level syndromes for a second

[n, n−r$_2$, r$_2$+1]-RS code. These syndromes are computed for each subblock in a block and added cumulatively to produce r$_2$ block check bytes which are shared by all subblocks. These block check bytes are stored after the last subblock in a block.

If the location of a subblock with an error burst is specified by an externally generated pointer and the number of errors in that subblock does not exceed $\lfloor r_1/2 \rfloor$, then the errors can be corrected by a subblock level decoder. If the number of errors does not exceed $\lfloor (r_1+r_2)/2 \rfloor$, then the errors may be corrected by combining the correction power of the subblock and block level check bytes.

If the location of the subblock with an error burst is unknown, however, this prior art two-level ECC system can locate the subblock with the error burst and correct the error burst provided the number of errors (i.e. its weight) does not exceed $\lfloor r_1/2 \rfloor + c$. This burst location and correction is achieved at the cost of lowering the maximal subblock error correction capability in all other subblocks from $\lfloor r_1/2 \rfloor - c$ where c is a fixed design parameter which is a positive integer such that $$c \leq \min\{ \lfloor (r_1+r_2)/2 \rfloor - \lfloor r_1/2 \rfloor, \lfloor r_1/2 \rfloor \}$$

DESCRIPTIVE OVERVIEW

Figure 2:
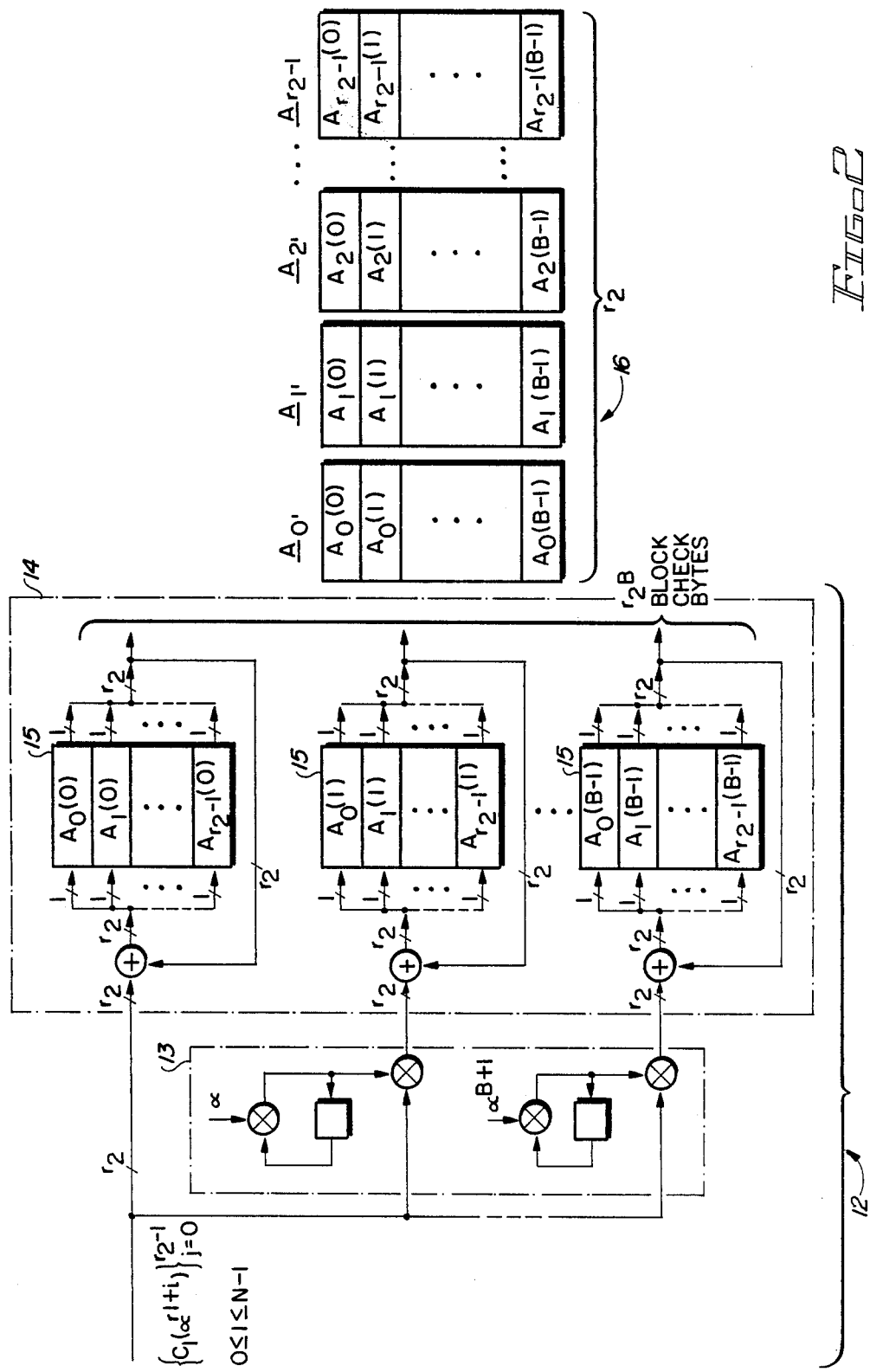
FIG. 2 is a schematic block diagram showing in more detail portions of the apparatus of FIG. 1 which computes block check bytes.

It should be noted that, in FIGS. 1-3, a diagonal slash across an input or output signifies that it consists of the specified number of bytes in parallel. Also, as hereinafter used, the term "error burst" is defined as any number of bytes with errors, whether or not the errors are consecutive, where this number exceed the first level (i.e., subblock) correction capability of the apparatus.

According to the invention, there are four parameters that establish the error correction capability of the two-level ECC apparatus. These are r$_1$, r$_2$, r$_3$ and B where:

r$_1$ is the number of subblock (first level) check bytes per subblock;

r$_2$ is the number of block (second level) check bytes per block;

r$_3$ is the number of the check bytes for the block check bytes, the number being sufficient so that all of the bytes in a block are equally protected; and B≧2T+S, where T and S denote the numbers of correctable subblocks with error bursts without and with, respectively, externally generated pointers to the correctable subblocks with error bursts. Thus, if B=4, correction can be achieved if T=0, with S≦4; if T=1, with S≦2; and with T=2, with S=0. The maximal number of errors in a subblock that can be corrected is $$\left[ \frac{r_1 + r_2}{2} \right].$$

As illustrated in FIG. 1, an encoder 10 encodes (n−r$_1$) bytes of data. The encoded n bytes of data are stored in a data field on a disk track 9. The encoded data is also supplied to syndrome computation circuitry 11 which generates r$_2$ block syndromes for each of the subblocks of the block. As earlier noted, each syndrome is one byte in length. These r$_2$ syndromes are supplied to block check computation circuitry 12 which, as shown in FIG. 2, comprises circuitry 13 and 14.

Circuitry 13 comprises means for multiplying the r$_2$ block syndromes for each subblock by a series of preselected cumulative weighting factors $\{\alpha^l, \ldots, \alpha^{l(B-1)}\}$ according to the location index l of the subblock within the block, where $\alpha$ is the primitive generator of the Galois finite field.

The different factor-weighted syndromes from each of the B buffers 15 are cumulatively summed by circuitry 14 for all the subblocks within the block to generate a total of r$_2$B block syndromes, which are reordered in a preselected fashion as shown at 16. After the last subblock of the block is written, encoder 17 (FIG. 1) encodes the r$_2$B block check syndromes and appends to them r$_3$ additional check bytes. The r$_2$B block check syndromes plus the r$_3$ additional check bytes are then stored at the end of the block on disk track 9 following the last subblock, N, in the block.

During reading of the data, and as illustrated in FIG. 3A, the n data bytes as read from each subblock of a block are stored in a buffer 18 and also concurrently fed to subblock syndrome computation circuitry 19. Circuitry 19 computes, for each subblock, subblock syndromes that are stored in a buffer 20. Those subblock syndromes that do not correspond to a subblock with an error burst are passed through a subblock data traffic controller 21 to a decoder 22. Externally generated pointers to subblocks with error bursts, if available, are also supplied to controller 21, stored in a location register 42. Decoder 22 produces in bus 23 an estimated error pattern for each of the subblocks without error bursts. These estimated error patterns in bus 23 are algebraically summed at 24 with the subblock data stored in buffer 18 to correct all correctable errors in these subblocks without error bursts and thereby provide in bus 25 corrected subblock data for those subblocks without error bursts.

Block level syndromes are then computed for each subblock from the estimated error pattern (in 23) by circuitry 26 (FIG. 3B) and from the corrected subblock data (in 25) by circuitry 27. Using block check byte computation circuitry 28 identical with that described for circuitry 12, the block level syndromes for the corrected subblock data are multiplied by the aforementioned series of preselected cumulative weighting factors according to their order of occurrence within the block and each block level syndrome as multiplied by a different weighting factor is stored in a respective one of the B buffers 15; and then these factor-weighted syndromes from the B buffers 15 are cumulatively summed to produce estimated block check syndromes covering all the subblocks of that block.

Decoder 30 (FIG. 3C) decodes the encoded block check syndromes generated during writing for all subblocks of each block. Each of these decoded block check syndromes is then algebraically summed with its corresponding estimated block check syndrome by a respective summing circuit 31 to provide a set of syndromes for a code for locating those subblocks having error bursts. Decoder 32 then decodes this set of syndromes to produce up to T algebraic pointers to the subblocks with error bursts. Concurrently, for each subblock with an error burst, decoder 32 produces a set of r$_2$ block level syndromes. Due to the effect of miscorrection at the subblock level, these r$_2$ block level syndromes must be updated. This is done by algebraically summing at 33 the block level syndromes computed by decoder 32 with the block level syndromes computed by circuitry 26 from the estimated error pattern syndromes to produce block level syndromes in bus 34 for the true error pattern for those subblocks having error burst.

Subblock data traffic controller 35 has as inputs: n representing the data bytes as read; S representing updated externally generated pointers from updated pointer set 42 to subblocks with error bursts; T representing algebraic pointers obtained from decoder 32 to subblocks with error bursts; the estimated error pattern from bus 23 that had been stored in a buffer 36 (FIG. 3B), and the block level syndromes for the true error pattern from bus 34.

For those subblocks without an error burst, controller 35 directs the n data bytes as read and the buffered $2r_1$ bytes for the estimated error pattern from buffer 36 to an algebraic summing circuit 37 to correct all subblocks without error bursts.

For those subblocks with error bursts, controller 35 directs to decoder 39 $r_2$ block syndromes for the true error pattern from bus 34 and also the $r_1$ subblock syndromes from buffer 20 for only those subblocks with error bursts. From these inputs decoder 39 produces an error pattern that is algebraically summed at 40 with only those of the subblocks as read which contain error bursts to provide a block of data in bus 41 in which all errors and erasures have been corrected up to the preselected capability of the apparatus.

As illustrated, all subblocks as read are buffered at 18 and directed to the traffic controller 35; and said controller channels those subblocks with error bursts to algebraic summing circuit 40 and those without error bursts via controller 35 to summing circuit 37. However, if preferred, the apparatus could be modified to buffer at 18 only those subblocks believed to have error bursts and to send only these via controller 35 to summing circuit 40.

The functions performed by computation circuitry 19 and $C_1$-decoder 22; by circuitry 26, 27 and $C^B$-decoder 32; by $C_3$-decoder 30; and by $C_{1,2}$-decoder 39 may be provided by respective separate semiconductor chips, such as the WD60C80 Error Detection and Correction Chip (EDAC) marketed by Western Digital Corp. of Irvine, Calif.

The encoder portion and decoder portion of the apparatus embodying the invention will now be described in greater detail, followed by an Appendix setting forth the proof establishing the operability and efficacy of the method and means herein disclosed.

DETAILED DESCRIPTION OF ENCODER PORTION (FIGS. 1 AND 2)

Assume that the data alphabet is formally represented by a finite, Galois Field with q symbols that is denoted by GF(q). For practical storage applications q is most commonly taken as $2^8$, i.e., each symbol in GF($2^8$) corresponds to a byte.

The l-th data subblock consists of the symbols $m_{j,l}$ GF(q), where $0 \leq j \leq n - r_1 - 1$ and $0 \leq l \leq N - 1$. This subblock is first encoded by the subblock level $[n, n - r_1, r_1 + 1]$-RS encoder 10. Mathematically, it is convenient to describe this data subblock in terms of the polynomial $$m_l(x) = \sum_{j=0}^{n-r_1-1} m_{j,l} x^j \quad (1)$$

The dummy variable x is introduced so that its powers can represent the order of appearance of the bytes in the subblock. Thus the j-th byte $m_{j,l}$ appears as the coefficient of $x^j$, $0 \leq j \leq n - r_1 - 1$, in the polynomial $m_l(x)$ that represents the l-th subblock. The polynomial formulation is convenient since it allows for the description of the encoding operation as polynomial multiplication. Encoder 10 for the subblock level code ($C_1$-code) is characterized by the encoding polynomial $$g_1(x) = \sum_{i=0}^{r_1-1} (x - \alpha^i) \quad (2)$$

The symbol $\alpha$ in GF(q) denotes a root of a primitive irreducible polynomial whose distinct powers form a representation of the nonzero elements of GF(q). Such a polynomial is a divisor of $x^{q-1} - 1$. The l-th encoded subblock is represented by the polynomial $$c_l(x) = m_l(x) g_1(x) \quad (3)$$

The encoding operation can be described in the frequency transform domain as forcing $r_1$ zeroes at the Galois Field symbol frequencies $\{\alpha^i\}$, i.e. $c_l(\alpha^i) = 0$, for $0 \leq i \leq r_1 - 1$.

The $C_1$-coded subblocks $\{c_l(x)\}, 0 \leq l \leq r_2 - 1$, are written on disk track 9 and, as shown in FIG. 1, are also simultaneously processed to produce shared block check syndromes using circuitry 12. The computation of these check syndromes is performed in two steps. In the first step, (see FIG. 1) the block $C_2$-syndrome values $\{(c_l(\alpha^{r_1+i})\}, 0 \leq i \leq r_2 - 1$, are evaluated at the Galois Field frequencies at which the $C_2$-zeroes are located. These nulls are at $\{\alpha^{r_1+i}\}$, $0 \leq i \leq r_2 - 1$, the zeroes of the encoding polynomial $g_2(x)$ for the $C_2$-code which is an $[n, n-r_2, r_2+1]$-RS code. The explicit expression for this encoding polynomial is $$g_2(x) = \sum_{i=0}^{r_2-1} (x - \alpha^{r_1+i}) \quad (4)$$

The encoding process as thus far described is known from the prior art. However, according to an important feature of the invention, in the second step each syndrome value $c_l(\alpha^{r_1+i}), 0 \leq i \leq r_2 - 1$, is weighed by a factor $\alpha^{bl}$ and cumulatively-weighted syndrome sums are generated as follows:

$$A_i(b) = \sum_{l=0}^{N-1} \alpha^{bl} c_l(\alpha^{r_1+i}), b = 0, 1, \ldots, B - 1, \quad (5)$$

$$i = 0, 1, \ldots, r_2 - 1$$

In the weight factor $\alpha^{bl}$, the parameter l, $0 \leq l \leq N - 1$ provides the subblock location inside the block, and the parameter b, $0 \leq b \leq B - 1$ indexes the B buffers 15 in which these cumulatively-weighted syndromes are computed and which are shown in FIG. 2. The total number of cumulatively-weighted $C_2$-syndromes is $r_2 B$ bytes, which are shared among all the subblocks in a block and referred to as block check syndromes. These block check syndromes are generally stored after the last written subblock in a block.

The block check syndromes have a special status that has to be addressed in the encoding portion. The $r_2 B$ block check syndromes computed in Equation (5) differ from the rest of the stored data because they are not protected from errors. This however is easily overcome by encoding them by using $[r_2 B + r_3, r_2 B, r_3 + 1]$-RS encoder 17. The parameter $r_3$ is chosen such that equal error protection for all stored data bytes is achieved.

If random and burst error statistics for the storage channel are available, then $r_3$ can be chosen such that equal error protection in a probabilistic sense is achieved. However, if accurate statistics are not available, a worst-case choice for $r_3$ can be made as follows. Typically $r_2B$ is much smaller than n and hence the block check syndromes can be considered as constituting a shortened data subblock. Assume that the channel can cause, in the worst case, up to t errors and s erasures in any subblock, such that $2t+s \leq r_1+r_2$, where an error is defined as a perturbation, the location and value of which are unknown, and an erasure is defined as a perturbation whose location is known by an external pointer, such that only the value of the error must be computed. Then $r_3 = r_1 + r_2$ ensures equal error protection for all data bytes. Encoder 17 thus protects the block check syndromes.

The enhanced error correction capability of applicants' improved two-level architecture composed of the subblock level [n, n−$r_1$, $r_1$+1] and block level [n, n−$r_2$, $r_2$+1]-RS codes $C_1$ and $C_2$, respectively, will now be discussed. Let t denote the desired number of correctable errors and s the desired number of correctable erasures in a subblock. With these values of the desired performance parameters s and t established, the design parameters $r_1$ and $r_2$ of the two-level architecture must satisfy the inequality $2t+s \leq r_1+r_2$ for each subblock to correct all errors.

A subblock is declared to have an error burst if its number of errors and erasures satisfy the inequalities $r_1 < 2t+s \leq r_1+r_2$. Let us denote by T the number of subblocks with error bursts whose locations are unknown and by S the number of subblocks with error bursts whose locations are given by externally generated pointers from set 42, both of which types of errors are to be corrected. If the number of B buffers of length $r_2$ each, which is the third design parameter of the proposed two-level architecture, is chosen to satisfy the inequality $2T+S \leq B$, then T+S will be the total number of correctable subblocks with error bursts. All the other subblocks for which $2t+s \leq r_1$ are without burst errors and are correctable by the subblock level code $C_l$.

DETAILED DESCRIPTION OF DECODER PORTION (FIGS. 3A–D)

The read back l-th subblock $c_l(x)$ differs from the written $C_l$-encoded subblock $c_l(x)$ by the error pattern polynomial $e_l(x)$ as follows:

$$\bar{c}_l(x) = c_l(x) + e_l(x) \quad (6)$$

where $$e_l(x) = \sum_{j=0}^{n-1} e_{j,l} x^j, e_{j,l} \text{ in } GF(q), 0 \leq j \leq n-1$$

The first step in the decoding process is computing the $C_1$-syndromes $\bar{c}_l(\alpha^i), 0 \leq i \leq r_1 - 1$ with circuitry 19. Since by definition $c_l(\alpha^i) = 0, 0 \leq i \leq r_1 - 1$, the $C_1$-syndromes are as follows:

$$\bar{c}_l(\alpha^i) = e_l(\alpha^i), \ 0 \leq i \leq r_1 - 1 \quad (7)$$

These syndromes are computed for all read back subblocks. In the next step $C_1$-decoder 22 processes these syndromes to produce a minimal Hamming distance estimate $\hat{e}_l(x)$ of the error pattern polynomial which is algebraically summed at 24 with the buffered read back subblock polynomial $\bar{c}_l(x)$. This computation is performed only on those subblocks which do not have pointers. The processing of the $C_1$-syndromes of all the other subblocks is deferred to the $C_{1,2}$-decoder 39. $C_1$-decoder 22 produces an estimated $C_1$-codeword $$\hat{c}_l(x) = \bar{c}_l(x) - \hat{e}_l(x) \quad (8)$$

where $\hat{e}_l(x)$ is the estimated error pattern.

If the l-th subblock has no error bursts, $C_1$-decoder 22 generates an estimated error pattern $\hat{e}_l(x)$ that is identical with the actual error pattern $e_l(x)$. Hence, $\hat{c}_l(x) = c_l(x)$. If the l-th subblock has an error burst and no pointer, attempting to correct it the $C_1$-decoder 22 will either fail or the error burst will be miscorrected. A decoder failure 43 generates a pointer in 42 that locates the l-th subblock as a subblock previously unknown to have an error burst. To include all the subblocks of a block in the subsequent discussion, it is assumed that when the location of a subblock with an error burst is given either by a pointer from 42 or from a failure (see 43) of $C_1$-decoder 22, then $$\hat{c}_l(x) = \bar{c}_l(x) \text{ and } \hat{e}_l(x) = 0.$$

Assume now that the l-th subblock is miscorrected, i.e., the estimated error pattern $\hat{e}_l(x)$ in 23 differs from the actual error pattern $e_l(x)$. There is the possibility that the miscorrection is a valid $C_2$-codeword and hence will pass through the decoder 39 shown in FIGS. 3D and invalidate the correction capability of the two-level architecture. To prove that this cannot happen, the Appendix includes Lemma 1, an analysis of the properties of the difference error pattern polynomial obtained as the difference between the actual and the estimated error pattern polynomials:

$$\bar{e}_l(x) = e_l(x) - \hat{e}_l(x) \quad (9)$$

Following the processing in $C_1$-decoder 22, S, the number of subblocks with error bursts whose locations are known is generally increased according to the proportional relationship of $2T+S \leq B$ as T, the number of subblocks having error bursts with unknown locations is decreased. The new erasures correspond to $C_1$-decoder failures that are transmitted via 43 to update location register 42.

The next step in the decoding process is the computation (at 26, 27) of the $C_2$-syndromes of the estimated $C_1$-codeword $\hat{c}_l(x)$ provided (in 25) by the $C_1$-decoder 22. These syndromes are used as inputs to the computation of the block check syndrome estimates (at 28). This computation is identical to the one described in FIG. 2 for circuitry 12, and the equations for the block syndrome byte estimates, similar to Equation (5), are as follows:

$$\hat{A}_i(b) = \sum_{l=0}^{N-1} \alpha^{bl} \hat{c}_l(\alpha^{r_1+i}), \ b = 0, 1, \ldots, B-1, \quad (10)$$

$$i = 0, 1, \ldots, r_2 - 1$$

The read back block check syndromes, stored after the last subblock are restored by the RS $C_3$-decoder 30. The inputs to this decoder are the noisy $r_2B$ block check syndromes $\overline{A}_i(b)$, $0 \leq b \leq B-1$, $0 \leq i \leq r_2 - 1$ and the $r_3$ check bytes which may also have incurred errors. The output of the decoder 30 is the restored $r_2B$ block check syndromes which are subtracted from the estimates computed in (10) to produce the differences $\Delta A_i(b) = \hat{A}_i(b) - A_i(b)$ explicitly given as follows:

$$\Delta A_i(b) = \sum_{l=0}^{N-1} \alpha^{bl}\hat{c}_l(\alpha^{r_1+i}) - \sum_{l=0}^{N-1} \alpha^{bl}c_l(\alpha^{r_1+i}) \quad (11)$$

$$= \sum_{l=0}^{N-1} \alpha^{bl}e_l(\alpha^{r_1+i})$$

The cumulative block level syndromes are $\bar{e}_1^i(\alpha^{r_1+i})$, $0 \leq l \leq N-1$, $0 \leq i \leq r_2-1$. By Lemma 1 these are zero if and only if the l-th subblock has no error bursts. If this l-th subblock has an error burst, then $\bar{e}_l^i$ is nonzero for some i in the range $0 \leq i \leq r_2-1$. In terms of these syndromes the i-th cumulative block syndrome polynomial $0 \leq i \leq r_2-1$ is defined as follows:

$$\bar{e}(x) = \sum_{l=0}^{N-1} \bar{e}_l x^l \quad (12)$$

The block check differences $\Delta A_i(b)$ are the values assumed by the polynomial defined in (12) at the locations $\alpha^b$ i.e.

$$\Delta A_i(b) = \bar{e}^i(\alpha^b), 0 \leq b \leq B-1 \quad (13)$$

Assume $\{l'_1, \ldots, l'_T\}$ to be the unknown locations and $(l''_1, \ldots, l''_S)$ to be the known locations of the subblocks with error bursts. The problem to be solved in the sequel is the computation of the unknown burst locations $\{l'_1, \ldots, l'_T\}$ and of the cumulative block syndromes $\bar{e}_l(\alpha^{r_1+i}), 0 \leq l \leq N-1, 0 \leq i \leq r_2-1$, for each l in the union set of known and unknown locations $l \in \{l'_1, l'_2, \ldots, l'_T\} \cup \{l''_1, l''_2, \ldots, l''_S\}$ of subblocks with error bursts. This problem is solved by introducing a novel interpretation of the cumulative block syndrome polynomials $\bar{e}^i(x)$, $0 \leq i \leq r_2-1$. For a fixed i, $\bar{e}^i(x)$ may be viewed as an error pattern polynomial for the whole block which consists of N subblocks, now viewed as a codeword in a [N, N−B, B+1]-RS code, denoted by $C^B$. The unknown locations $\{l'_1, \ldots, l'_T\}$ of subblocks with error bursts, as well as the nonzero syndrome values $\bar{e}_l$, $0 \leq i \leq r_2-1$ defined previously, are obtained from $C^B$-decoder 32. This decoder has the required decoding capability because the cumulative block syndrome polynomials $\bar{e}^i(x)$ used at its input represent error patterns composed of at most S erasures and T random errors, and the design parameter B satisfies the inequality $2T+S \leq B$. By Lemma 1 it is known that the l-th subblock has no error bursts if the block syndromes $\bar{e}_l^i$, $0 \leq i \leq r_2-1$ are all zero and in this case the $C_1$-estimated codeword $\hat{c}_l(x)$ is the decoded output which is passed through controller 35 to algebraic summing circuit 37. However, if this is not the case, i.e. the l-th subblock has an error burst, then a further step is required.

This step, which is the last step in the decoding process of a subblock with an error burst, is the processing of the complete string of syndromes $e_l(\alpha^i)$, $0 \leq i \leq r_1+r_2-1$ by the decoder 39 for the RS-code $C_{1,2}$ which has the parameters $[n, n-r_1-r_2, r_1+r_2+1]$. This complete string of syndromes is obtained by combining (at 40) the two disjoint strings of syndromes that have been computed in the steps previously described. The first substring of syndromes, $e_l(\alpha^i), 0 \leq i \leq r_1-1$, is obtained in the first step of the decoding process as the $C_1$-syndromes. The second substring, $e_l(\alpha^{r_1+i})$, $0 \leq i \leq r_2-1$, is known as can easily be shown by writing the explicit equation for these values using (9):

$$e_l(\alpha^{r_1+i}) = \bar{e}_l(\alpha^{r_1+i}) + \hat{e}_l(\alpha^{r_1+i}), 0 \leq i \leq r_2-1 \quad (14)$$

The terms $\bar{e}_l(\alpha^{r_1+i}), 0 \leq i \leq r_2-1$, at the right side of (14) are precisely the cumulative block syndromes $\bar{e}_1^i$, $0 \leq i \leq r_2-1$, which are obtained from the $C^B$-decoder 32. The remaining terms at the right side of (14), $\hat{e}_l(\alpha^{r_1+i}), 0 \leq i \leq r_2-1$ are obtained by evaluating the error pattern estimate $\hat{e}_l(x)$ which is computed by the $C_1$-decoder 22 at the locations $\alpha^{r_1+i}, 0 \leq i \leq r_2-1$.

Figure 3C:
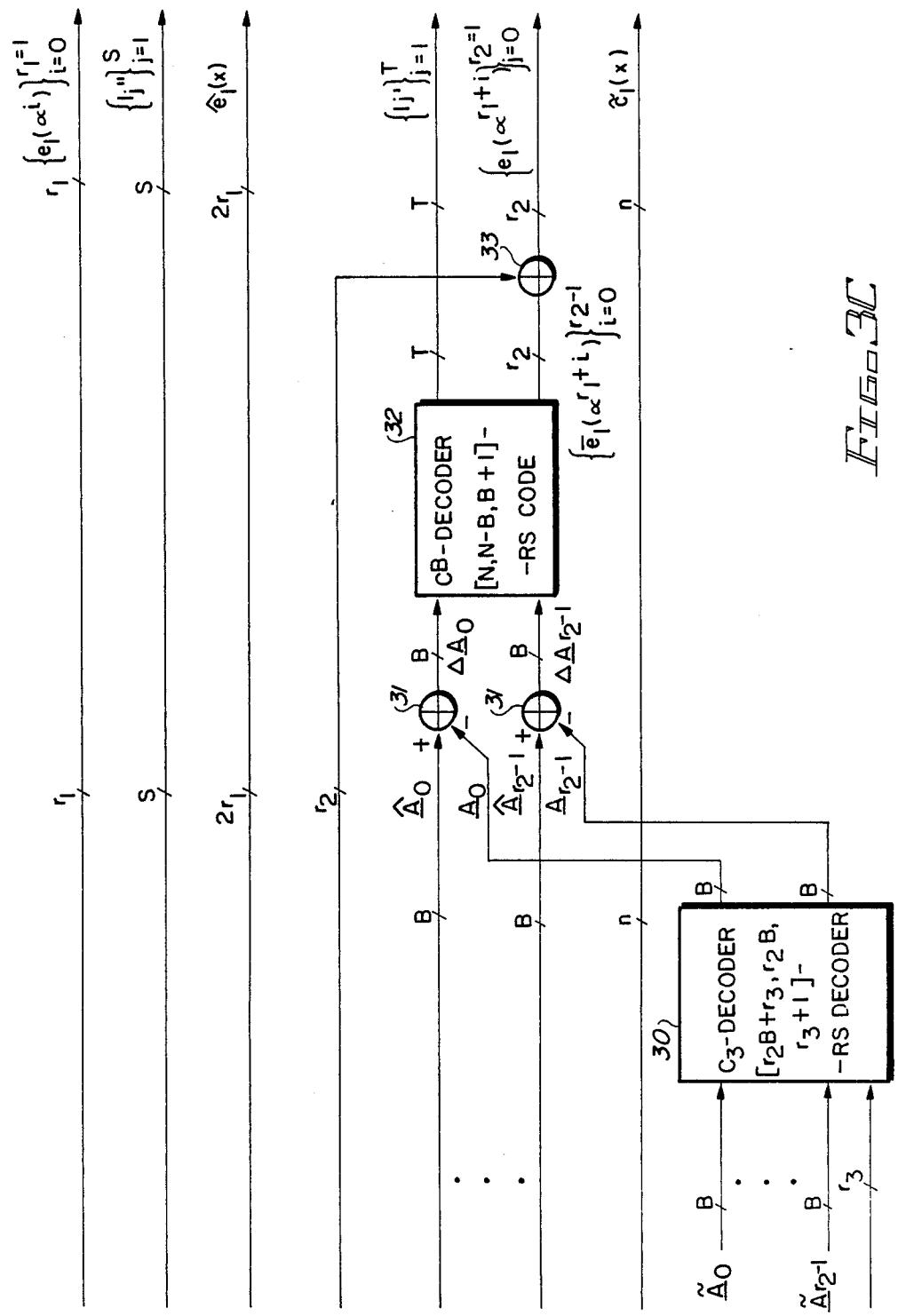

It will thus be seen that the decoding process described in this section and illustrated in FIGS. 3A–D provides the complete set of syndromes $\{e_l(\alpha^i)\}$, $0 \leq i \leq r_1+r_2-1$ required by the $[n, n-r_1-r_2, r_1+r_2+1]$-decoder 39, designated the $C_{1,2}$-decoder This decoder completes the process of correcting subblocks with error bursts by producing the error pattern $e_l(x)$ which is subtracted (at 40) from $\bar{c}_l(x)$ as shown in FIG. 3D.

It will now be apparent that if S and T denote the number of subblocks with error bursts whose locations are respectively known and unknown, the method and means of our architecture embodying the invention and above-described, is capable of locating and correcting all the combinations of subblocks with error bursts in a block for which the condition $2T+S \leq B$ is true, where B is the number of buffers 15. This is achieved without lowering the subblock level error correction capability by using the differences between the stored and the recomputed block check syndromes as block syndrome inputs to the RS-decoder 32.

It will also be seen that the architecture above-described requires the minimum number of check bytes for a selected error correction capability; namely, $Nr_1+Br_2+r_3$ where, as earlier stated, N is the number of subblocks per block, $r_1$ is the number of subblock check bytes in the encoded subblock, $r_2$ is the number of block check bytes in the block, and $r_3$ is that number of check bytes for the block check bytes sufficient to equally protect all of the bytes of the block, and where all combinations of T and S such that $2T+S \leq B$ must be provided for.

If, however, the constraint S=O is imposed (i.e., no externally generated pointers to subblocks are available), then this architecture may be modified and, as proved by Lemma 2 in the Appendix, the total number of check bytes can be decreased to $2t_1N+3(t_2-t_1)T+2t_3$ where $t_1$ and $t_2$ denote the number of desired correctable random errors at the subblock and block levels, respectively; $t_1 \leq t_2$; $t_3$ is the maximum number of errors in the block check syndromes; and T is the desired number of correctable subblocks having burst errors to which no pointers are available.

APPENDIX I

LEMMA 1

The difference between the actual and the estimated error patterns produced by the $C_1$-decoder 22 represented as the error difference polynomial $\bar{e}_l(x)$ is always a $C_1$-codeword. However, if it is nonzero because a miscorrection due to an error burst (i.e., an error exceeding the first level correction capability) has occurred, it is not a $C_2$-codeword and hence its $C_2$-syndrome bytes will be nonzero. These nonzero $C_2$-syndromes will be used to undo this miscorrection.

PROOF

From Equations (6) and (8), it is known that $\hat{c}_l(x) = c_l(x) + \hat{e}_l(x) - (x)$ and in conjuction with (9) $\bar{e}_l(x) = \hat{c}_l(x) - c_l(x)$ is easily obtained. Since both $\hat{c}_l(x)$ and $c_l(x)$ are codewords in $C_1$, their difference $\bar{e}_l(x)$ is also a codeword because $C_1$ is a linear code. As stated above, if the l-th subblock has no error bursts, then the actual and the estimated error patterns are identical and the difference is zero. In case the l-th subblock has an error burst, its actual error pattern exceeds the correction capability of the $C_1$-ecoder 22 and the estimated error pattern, in case of miscorrection, will differ from the actual one thus resulting in a nonzero difference.

Assume now that the actual pattern $e_l(x)$ consists of s erasures and t' random errors, where $2t' + s \leq r_1 + r_2$. In case of miscorrection the $C_1$-decoder 22 estimates an error pattern polynomial $\hat{e}_l(x)$ whose errors are confined to the s erasures and furthermore to t' random errors such that $2t's \leq r_1$. The error pattern after miscorrection, $\bar{e}_l(x)$, is the difference of the two; and thus its Hamming weight is at most $s + t' + t'' \leq r_1 + \lfloor r_2/2 \rfloor \leq r_1 + r_2$. Now consider the linear code $C_{1,2}$ (in 39) which is specified by the encoder polynomial $= g_{1,2}(x) = (x-1)(x-\alpha)(x-\alpha^2) \ldots (x-\alpha^{r_1+r_2-1})$ It is thus defined as the RS-code with the parameters $[n, n-r_1-r_2, r_1+r_2+1]$; i.e., its minimal Hamming weight is $r_1 + r_2 + 1$. Since the Hamming weight of $\bar{e}_l(x)$ is at most $r_1 + r_2$ it cannot be a codeword in $C_{1,2}$. However $\bar{e}_l(x)$ is a codeword in $C_1$ and since $C_{1,2}$ is specified in terms of the nonoverlapping spectral nulls of $C_1$ and $C_2$, it has been proved that it cannot be a codeword in $C_2$.

APPENDIX II

LEMMA 2

The total number of check bytes can be reduced to $2t_1N + 3(t_2 - t_1)T + 2t_3$ because the block syndrome values $\bar{e}_l(\alpha^{r_1+i})$ of an error difference polynomial $\bar{e}_l(x)$ for a subblock with an error burst are not all zero in the range $0 \leq i \leq \lfloor r_2/2 \rfloor - 1$.

PROOF

From the proof of Lemma 1, it has been shown that $\bar{e}_l(x)$ is a codeword in $C_1$ and furthermore that its Hamming weight is at most $r_1 + \lfloor r_2/2 \rfloor$. Now assume that the converse is true; i.e. $\bar{e}_l(\alpha^{r_1+i}) = 0, 0 \leq i \leq \lfloor r_2/2 \rfloor - 1$. Since $\bar{e}_l(x)$ is a codeword in $C_1$, $\bar{e}(\alpha^i) = 0, 0 \leq i \leq r_1 + \lfloor r_2/2 \rfloor - 1$. Since $\bar{e}_l(x)$ may be considered as a codeword in a $[n, n-r_1 - \lfloor r_2/2 \rfloor, r_1 + \lfloor r_2/2 \rfloor + 1]$-RS code. But this leads to a contradiction since from the proof of Lemma 1, it has been shown that the Hamming weight of $\bar{e}_l(x)$ is at most $r_1 + r_2/2$ and thus we have a nonzero value $\bar{e}_l(\alpha^{r_1+i}) \neq 0, 0 \leq i \leq \lfloor r_2/2 \rfloor - 1$.

Lemma 2 suggests that using the $C^B$-decoder 32, $\lfloor r_2/2 \rfloor$ instead of $r_2$ times is sufficient to determine the locations of the subblocks with error bursts as well as their block syndromes $\bar{e}_l$, $0 \leq i \leq \lfloor r_2/2 \rfloor - 1$. To compute the remaining half $\bar{e}_l$, $\lfloor r_2/2 \rfloor \leq i \leq r_2 - 1$, of these syndromes, since their locations are a known, the $C^B$-decoder 32 requires only $\bar{e}_l(\alpha^b) = \Delta A_i(b)$, $\lfloor r_2/2 \rfloor \leq i \leq r_2 - 1, 0 \leq b \leq T-1$ rather than $0 \leq b \leq B-1$. Because $B = 2T$ and $r_2 = 2(t_2 - t_1)$, it is unecessary to compute the $T(_2-t_1)$ block check bytes $\Delta A_i(b)$, $\lfloor r_2/2 \rfloor \leq i \leq r_2 - 1 T \leq b \leq B-1$ and the total number of check bytes in the architecture embodying the invention can be reduced to $2t_1N + 3(t_2-t_1)T + 2t_3$.

We claim:

1. A method of correcting multiple error bursts in data recorded on a storage medium in blocks, each of which comprises a plurality of subblocks of data bytes and subblock check bytes, and block level syndromes from which block check syndromes are generated and stored after the last subblock of the block, from which decoded and estimated block check syndromes are generated during reading, comprising the steps, after reading the data, of:

algebraically summing (at 31) the decoded block check syndromes (from 30) and the estimated block check syndromes (from 28, with 14) to provide a set of block check syndromes for a code for locating up to T subblocks having an error burst for which no externally generated pointers are available;

decoding (at 32) said set of syndromes for identifying each said subblock having an error burst; and computing (in 32) block level syndromes identifying locations and values of the errors within said subblocks having error bursts and no pointers.

2. The method of claim 1, wherein the maximal number of errors that can be corrected in each such subblock is $r_1 + r_2$, where $r_1$ is the number of subblock check bytes and $r_2$ is the number of block level syndromes.

3. The method of claim 2, wherein the total number of check bytes required is $2t_1N + 3(t_2-t_1)T + 2t_3$ where $t_1$ and $t_2$ denote the number of desired correctable random errors at the subblock and block levels, respectively; $t_1 < t_2$; $t_3$ is the maximum number of errors in the $r_2$ block level syndromes; and T is the desired number of correctable subblocks having burst errors to which no pointers are available.

4. The method of claim 1, wherein the minimum number of check bytes for a selected error correction capability is $Nr_1 + Br_2 + r_3$ where N is the number of subblocks per block, $r_1$ is the number of subblock check bytes in the encoded subblock, $r_2B$ is the number of block check syndromes in the block, and $r_3$ is that number of check bytes for the block check syndromes sufficient to equally protect all of the bytes of the block, and S and T denote respectively the number of correctable subblocks with error bursts for which externally generated pointers are and are not available, and where all combinations of T and S such that $2T + S \leq B$ must be provided for.

5. The method of claim 1, including the further step of:

algebraically summing the computed block level syndromes (from 32) with the block level syndromes (from 26) for an estimated error pattern to produce (in 34) block level syndromes for a true error pattern for up to T subblocks having error bursts.

6. A method of correcting multiple error bursts in data recorded on a storage medium in blocks, each of which comprises subblocks of data bytes and subblock check bytes, and block level syndromes from which block check syndromes are generated and stored after the last subblock of the block, from which ECC syndromes are generated during reading, said method comprising the steps, during writing of the data, of:

encoding (at 10) the data in all subblocks of a block;

generating (at 11) $r_2$ block level syndromes for said subblocks;

multiplying (at 13) said $r_2$ syndromes by a series of preselected weighting factors ($\alpha^1 \ldots \alpha^{1(B-1)}$) according to as location index l of the subblock within the block;

storing each of the $r_2$ syndromes as multiplied by a respective weighting factor in a corresponding one of B buffers;

cumulatively summing (at 14) the contents of said B for all the subblocks within the block to produce $r_2B$ block check syndromes for that block;

after writing the last subblock of the block, encoding the $r_2B$ block check syndromes (at 17) to provide $r_3$ check bytes to protect the $r_2B$ block check syndromes; and storing (at 9) the factor weighted sums and $r_3$ check bytes ($r_2B+r_3$) on the medium as block check syndromes.

7. The method of claim 6, wherein the number of correctable subblocks with error bursts is determined by $2T+S \leq B$, where T denotes the number of correctable subblocks with error bursts for which no externally generated location pointer is available and S denotes the number of correctable subblocks with error bursts for which externally generated pointers are available.

8. The method of claim 6, including the further steps, during reading of the data, of:

buffering (at 18) data as read from each subblock of the block;

computing (at 19) subblock syndromes for each subblock;

decoding (at 22, via 21) those of the subblock syndromes that do not correspond to a subblock with an error burst for producing (in 23) an estimated error pattern for each of the last-mentioned subblocks; and correcting all correctable errors in said last-mentioned subblocks by algebraically summing (at 24) their respective estimated error patterns (in 23) the buffered subblock data (from 18) as read to provide corrected subblock data.

9. The method of claim 8, including the further steps, for each block, of:

computing block level syndromes from both the estimated error patterns (at 26) and corrected subblock data (at 27);

multiplying (at 28, with 13) the block level syndromes for the corrected subblock data by said series of preselected weighting factors ($\alpha^1 \ldots \alpha^1(B-1)$) according to the location index of the subblock within the block;

storing each syndrome as multiplied by a respective weighting factor in a corresponding one of B buffers;

cumulatively summing (at 28, with 14) the contents of said B buffers as stored during the preceding step to produce estimated block check syndromes covering all subblocks of the block;

decoding (at 30) the last-mentioned block check syndromes as encoded; and algebraically summing (at 31) the decoded block check syndromes (from 30) with the estimated block check syndromes (from 28) to provide a set of block check syndromes for a code for locating subblocks having error bursts for which no externally generated pointers are available.

10. The method of claim 9, including the further steps, for each block, of:

decoding (at 32) said set of block check syndromes to generate (up to T) algebraic pointers for identifying the subblocks with error bursts for which no externally generated pointers are available;

computing (at 32) block level syndromes identifying any errors due to miscorrection during decoding of the subblock syndromes; and algebraically summing (at 33) the computed block level syndromes (from 32) identyifying miscorrections with the block level syndromes computed (at 26) from the estimated error pattern syndromes to generate the block level syndromes for a true error pattern (in 34).

11. The method of claim 10, including the further step of:

correcting (at 37) all subblocks without error bursts following generation of the algebraic pointers that locate all error bursts.

12. The method of claim 10, including the further steps, for each block, of:

buffering (at 20) the computed subblock syndromes;

decoding (at 39) the buffered computed subblock syndromes (from 20) and the block level syndromes (in 34) of the true error pattern, to generate an estimated burst error pattern; and algebraically summing (at 41) the estimated burst error pattern with the buffered data as read (from 18) to correct all errors in the subblocks having error bursts.

13. The method of claim 6, wherein the maximal number of errors that can be corrected in each such subblock is $r_1+r_2$, where $r_1$ is the number of subblock check bytes and $r_2$ is the number of block level syndromes.

14. The method of claim 6, wherein the number of correctable subblocks with error bursts is determined by $2T \leq B$ where T denotes the number of correctable subblocks with error bursts for which no externally generated location pointer is available.

15. The method of claim 6, wherein the number of correctable subblocks with error bursts is determined by $S \leq B$ where S denotes the number of correctable subblocks with error bursts for which externally generated pointers are available.

16. Apparatus for correcting multiple error bursts in data recorded on a storage medium in blocks, each of which comprises a plurality of subblocks of data bytes and subblock check bytes, and block level syndromes from which block check syndromes are generated and stored after the last subblock of the block, from which decoded and estimated block check syndromes are generated during reading, said apparatus comprising:

means operative following reading of the data for algebraically summing (at 31) the decoded block check syndromes (from 30) and the estimated block check syndromes (from 28) to provide a set of block check syndromes for a code for locating subblocks having an error burst for which no externally generated pointer is available;

means (32) for decoding said set of block check syndromes for identifying each subblock having an error burst; and means (32) for computing block level syndromes identifying the locations and the values of the errors within said subblocks having error bursts and no pointers.

17. Apparatus for correcting multiple error bursts in data recorded on a storage medium in blocks, each of which comprises subblocks of data bytes and subblock check bytes, and block level syndromes from which block check syndromes are generated and stored after the last subblock of the block for which ECC syndromes are generated during reading, said apparatus comprising;

means (10) operative during writing of the data for encoding the data in all subblocks of a block;

means (11) for generating block level syndromes for said subblocks;

means (13) for multiplying said syndromes by a series of preselected weighting factors $(a^1 \ldots a^{l(B-1)})$ according to a location index l of the subblock within the block;

B buffers each for storing a syndrome as multiplied by a different weighting factor;

means (14) for cumulatively summing the contents of said B buffers for all the subblocks within the block to produce block check syndrome ($r_2B$) for that block; and means (including 17), operative after writing the last subblock of the block, for encoding said last-mentioned block check syndromes ($r_2B$) to provide check bytes ($r_3$) to protect said block check syndromes ($r_2B$) so that encoded sums ($r_2B+r_3$) of said block check syndromes and check bytes may be stored on the medium as block check syndromes.

18. The apparatus of claim 17, comprising:

means (18), operative during reading of the data, for buffering the data as read from each subblock of the block;

means (19) for computing subblock syndromes for each subblock;

means (22) for decoding those of the subblock syndromes that do not correspond to a subblock with an error burst for producing an estimated error pattern for each of the last-mentioned subblocks; and means (24) for correcting all correctable errors in said last-mentioned subblocks by algebraically summing their respective estimated error patterns with the buffered subblock data as read (from 18) to provide corrected subblock data.

19. The apparatus of claim 18, comprising:

means (26, 27) for computing block level syndromes from the estimated error patterns and corrected subblock data;

means (28) for multiplying the block syndromes for the corrected subblock data by said series of preselected weighting factors according to $(\alpha^1 \ldots \alpha^1(B-1))$ according to a location index l of the subblock within the block, each syndrome as multiplied by a respective weighting factor being stored in a corresponding one of said B buffers;

means (28) for cumulatively summing contents of said B buffers to produce estimated block check syndromes covering all subblocks of the block;

means (30) for decoding the encoded last-mentioned block check syndromes; and means (31) for algebraically summing the decoded block check syndromes with the estimated block check syndromes to provide a set of block check syndromes for a code for locating subblocks having error bursts for which no externally generated pointers are available.

20. The apparatus of claim 19, comprising:

means (32) for decoding said set of syndromes and generating algebraic pointers for identifying the subblocks with error bursts;

means (32) for computing block level syndromes identifying any errors due to miscorrection during decoding of the subblock syndromes; and means (33) for algebraically summing the computed (by 26, 27) block level syndromes identifying miscorrections with the block level syndromes computed from the estimated error pattern syndromes to generate the block level syndromes for a true error pattern.

21. The apparatus of claim 20, comprising:

means (37) for correcting all subblocks without error bursts following generation of the algebraic pointers that locate all error bursts.

22. The apparatus of claim 20, comprising:

means (20) for buffering the computed subblock syndromes;

means (39) for decoding the buffered computed subblock syndromes (from 20) and the block level syndromes (in 34) of the true error pattern, to generate an estimated burst error pattern; and means (41) for algebraically summing the estimated burst error pattern with the buffered data as read (from 18) to correct all errors in the subblocks having error bursts.

* * * * *

UNITED STATES PATENT AND TRADEMARK OFFICE
CERTIFICATE OF CORRECTION

PATENT NO. : 4,951,284
DATED : August 21, 1990
INVENTOR(S) : Abdel-Ghaffar et al.

It is certified that error appears in the above-indentified patent and that said Letters Patent is hereby corrected as shown below:

Column 3, line 10, delete "leve", insert -- level --.

Column 3, line 21, after"]", insert -- to $\lfloor r_1/2 \rfloor$ --.

Column 6, Formula 5, after "$c_i$(", delete "$a^{r_1}$", insert -- a $r_1$ --.

Column 7, line 49, delete "$c_1(x)$" insert -- $\tilde{c}_1(x)$ --.

Column 7, equation 6, delete "equation", insert -- $\tilde{c}_i(x) = c_i(x) + e_i(x)$ --.

Column 8, line 2, delete "$e_1(x)$" insert -- $\hat{e}_1(x)$ --.

Column 8, line 6, delete "$c_1(x)$". insert -- $\tilde{c}_1(x)$. --.

Column 9, line 5, delete whole line, insert -- ) = $\hat{A}_i$, (b) - $A_i$(b) explicitly given as follows: --.

Column 9, line 13, after "are", delete equation, insert -- $\bar{e}_1^i(\alpha^{r_1}+i)$, --.

UNITED STATES PATENT AND TRADEMARK OFFICE
CERTIFICATE OF CORRECTION

PATENT NO. : 4,951,284
DATED : August 21, 1990
INVENTOR(S) : Abdel-Ghaffar et al.

It is certified that error appears in the above-indentified patent and that said Letters Patent is hereby corrected as shown below:

Column 9, Formula 12, delete "formula", insert --

$$\overline{e}^i(x) = \sum_{l=0}^{N-1} \overline{e}_l^i x^l \quad --.$$

Column 9, line 45, after "values", delete " $\overline{e}_1$," insert -- $\overline{e}_1^i$, --.

Column 9, line 58, delete " deooding", insert -- decoding --.

Column 10, delete Formula 14, insert --

$$e_l(\alpha^{r_1+i}) = \bar{e}_l(\alpha^{r_1+i}) + \hat{e}_l(\alpha^{r_1+i}), 0 \leq i \leq r_2 - 1 \quad --.$$

Column 10, line 9, after "(14)", delete " $a^{r_1''}$, insert -- $a^{r_1}$ --.

Column 10, line 12, delete " $a^{r_1''}$, insert -- $a^{r_1}$ --.

Column 11, line 6, delete "whole equation", insert --
$\hat{c}_l(x) = c_l(x) + e_l(x) - \hat{e}(x)$ --.

UNITED STATES PATENT AND TRADEMARK OFFICE
CERTIFICATE OF CORRECTION

PATENT NO. : 4,951,284

DATED : August 21, 1990

INVENTOR(S) : Abdel-Ghaffar et al.

It is certified that error appears in the above-indentified patent and that said Letters Patent is hereby corrected as shown below:

Column 11, line 28, delete "whole equation", insert -- $(x-a^{r_1}+r_2-1)$ --.

Column 11, line 41, after "ues", delete " $\overline{e}_1(a^{r_1}+i)$ ", insert -- $\overline{e}_1(a^{r_1}+i)$ --.

Column 11, line 48, delete " $r_2 2$ ", insert -- $r_2/2$ --.

Column 11, line 49, in the equation, delete " $a^{r_1}$ ", insert -- $a^{r_1}$ --.

Column 11, line 56, in the equation, delete " $a^{r_1}$ ", insert -- $a^{r_1}$ --.

Column 11, line 65, after "j", INSERT -- $\leq$ --.

Column 11, line, 67, after "(", insert -- t --.

Column 11, line 68, after " - 1", insert --, --.

Column 12, line 23, after "of", delete "the".

Signed and Sealed this

Sixth Day of June, 1995

BRUCE LEHMAN

*Attest:*

*Attesting Officer*  *Commissioner of Patents and Trademarks*